United States Patent [19]

Eshita et al.

[11] Patent Number: 4,876,219
[45] Date of Patent: Oct. 24, 1989

[54] METHOD OF FORMING A HETEROEPITAXIAL SEMICONDUCTOR THIN FILM USING AMORPHOUS BUFFER LAYERS

[75] Inventors: Takashi Eshita, Inagi; Fumitake Mieno; Yuji Furumura, both of Kawasaki; Takuya Watanabe, Sagamihara, all of Japan

[73] Assignee: Fujitsu Limited, Kawasaki, Japan

[21] Appl. No.: 318,638

[22] Filed: Mar. 3, 1989

[30] Foreign Application Priority Data

Mar. 4, 1988 [JP] Japan .................................. 63-49652

[51] Int. Cl.⁴ ............................................ H01L 21/20
[52] U.S. Cl. ........................... 437/126; 148/DIG. 25; 148/DIG. 72; 148/DIG. 97; 148/DIG. 154; 148/DIG. 169; 156/612; 437/107; 437/108; 437/111; 437/132; 437/976
[58] Field of Search ............... 148/DIG. 25, DIG. 56, 148/DIG. 65, DIG. 72, DIG. 97, DIG. 101, DIG. 110, DIG. 149, DIG. 154, DIG. 169, 33.4, 33.5; 156/610–615; 427/255.1, 255.2; 437/81, 82, 105, 107, 108, 111, 112, 939, 946, 973, 976, 126, 132

[56] References Cited

U.S. PATENT DOCUMENTS

| 4,554,030 | 11/1985 | Haisma et al. | 156/612 |
| 4,559,091 | 12/1985 | Allen et al. | 437/84 |
| 4,699,688 | 10/1987 | Shastry | 156/606 |
| 4,707,216 | 11/1987 | Morkoc et al. | 156/610 |
| 4,774,205 | 9/1988 | Choi et al. | 437/132 |

OTHER PUBLICATIONS

Koch et al., "The Growth of GaAs on Si by Molecular Beam Epitaxy", Mat. Res. Soc. Symp. Proc. vol. 67, 1986, pp. 37–44.
Fischer et al., "Dislocation Reduction in Epitaxial GaAs on Si (100)", Appl. Phys. Lett., 59 (6), Mar. 15, 1986, pp. 2161–2164.
Chong et al., "Growth of High Quality GaAs Layers Directly on Si", J. Vac. Sci. Technol., 35 (3), May/Jun. 1987, pp. 815–818.
Akiyama et al., "Growth of High Quality GaAs Layers on Si", J. Crys. Growth, 77 (1986), pp. 490–497.
Chand et al., "Significant . . . Molecular Beam Epitaxially Grown GaAs on Si (100)," Appl. Phys. Lett. 49 (13), Sep. 29, 1986, pp. 815–817.
M. Akiyama et al. "Growth of GaAs on Si and its Application . . . " Mat. Res. Soc. Symp. vol. 67, 1986, pp. 53–64.
N. El-Masry et al. "Defect Reduction in GaAs Epilayers on Si . . . " Mat. Res. Soc. Symp. vol. 91, 1987, pp. 99–103.

Primary Examiner—Brian E. Hearn
Assistant Examiner—William Bunch
Attorney, Agent, or Firm—Staas & Halsey

[57] ABSTRACT

A method of forming a semiconductor thin layer on a silicon substrate comprising the steps of depositing a first amorphous layer of a compound semiconductor (e.g., GaAs) on the silicon substrate, and growing a first epitaxial layer of the compound semiconductor on the amorphous layer, characterized in that the method comprises the steps of: after the epitaxial growth step, depositing a second amorphous layer of the compound semiconductor on the first epitaxial layer, and growing a second epitaxial layer of the compound semiconductor on the second amorphous layer. The obtained GaAs/Si substrate has a reduced dislocation density.

8 Claims, 2 Drawing Sheets (X 870)

(X 870)

METHOD OF FORMING A HETEROEPITAXIAL SEMICONDUCTOR THIN FILM USING AMORPHOUS BUFFER LAYERS

BACKGROUND OF THE INVENTION

1. Field of the Invention

The present invention relates to the formation of a semiconductor thin film, and more particularly, to a method of forming a compound semiconductor thin film on a silicon substrate. The present invention is applied to a GaAs/Si substrate for GaAs devices, which substrate is produced by growing an epitaxial GaAs thin film on a silicon (Si) substrate.

2. Description of the Related Art

A compound semiconductor substrate, for example, gallium arsenide (GaAs) substrate is produced by growing a single-crystal (GaAs) lump (ingot) by the use of a pulling method (Czochralski method) or the like, and then cutting the lump. Such a GaAs substrate is expensive, easily broken, and has a relatively small size.

Recently, proposals have been made to produce GaAs/Si substrates corresponding to the GaAs substrate, to enlarge the wafer size, increase the mechanical strength and thermal conductivity, and reduce costs. In this case, a large lattice mismatch of about 4% exists between GaAs and Si, and this hinders the epitaxial growth of GaAs, and accordingly, a buffer layer having a strained layer superlattice (SLS) structure is inserted between the Si substrate and the GaAs layer to relax the lattice mismatch. The SLS structure buffer layer is compressed of InGaAs-GaAs, GaAsP-GaAs or InGaAs-GaAsP system as disclosed, for example, in N. El-Masry, et al. "Defect Reduction in GaAs Epilayers on Si Substrates Using Strained Layer Superlattices", Mat. Res. Symp. Proc. Vol. 91, '1987, Materials Research Society, pp. 99–103. Nevertheless, the formation of the SLS structure buffer layer is complicated.

Attempts have been made to grow the GaAs layer directly on the Si substrate by adopting a two-step growth sequence (process), as disclosed in, for example, M. AKIYAMA et al., "Growth of GaAs on Si and its Application to FETs and LEDs", Mat. Res. Soc. Symp. Proc. Vol. 67, 1986, pp. 53–64. In the two-step growth sequence, the Si substrate (wafer) is heated to about 900° C. in a gas flow of $H_2$ and $AsH_3$ to clean the surface thereof, is cooled to 450° C. or less and a first GaAs thin layer is deposited on the Si substrate by a methalorganic chemical vapor deposition (MOCVD) method. Subsequently, the Si substrate is reheated to a temperature of from 700° to 750° C., a conventional GaAs growth temperature for the MOCVD method, and then a second GaAs layer is epitaxially grown by the MOCVD method. The first GaAs thin layer has an amorphous or an unstable crystal structure upon deposition and is changed into an epitaxial GaAs thin layer by the annealing (heating) of the second GaAs layer growth.

In the GaAs epitaxial thin film formed directly on the Si substrate, however, crystal defects, such as a high density of dislocations and many etch pits, still occur, due to differences in the lattice constants and thermal expansion coefficients of Si and GaAs. These crystal defects cause problems in devices which are formed by using the GaAs epitaxial film, for example, a reduced electron mobility bringing a lower switching speed of a GaAs transistor, a large dispersion of threshold voltages of GaAs transistors in a wafer (i.e., the GaAs/Si substrate), and a shorter life of light emitting devices such as lasers and LED's.

SUMMARY OF THE INVENTION

An object of the present invention is to reduce the crystal defects generated in a GaAs epitaxial thin film of a GaAs/Si substrate.

Another object of the present invention is to provide a method of forming a semiconductor (especially a compound semiconductor) thin film having less crystal defects on a Si substrate.

Still another object of the present invention is to provide a GaAs/Si substrate which contributes to improvements of the properties of devices formed by using the substrate.

The above-mentioned and other objects of the present invention are attained by providing a method of forming a semiconductor thin layer on a silicon substrate, comprising the steps of depositing a first amorphous layer of a compound semiconductor on the silicon substrate, and growing a first epitaxial layer of the compound semiconductor on the amorphous layer, according to the present invention, wherein after the epitaxial growing step, a second amorphous layer of the compound semiconductor is deposited on the first epitaxial layer, and a second epitaxial layer of the compound semiconductor is grown on the second amorphous layer.

Preferably the deposition of the amorphous layer and the growth of the epitaxial layer, which layers are made of the same compound semiconductor material, e.g., a III-V compound semiconductor, such as GaAs, AlGaAs, InP, GaP, InGaAs and InGaAsP, are repeated.

Dislocations generated at the interface between the Si substrate and the compound semiconductor layer appear in the first epitaxial compound semiconductor layer and then propagate upwards into the subsequently grown compound semiconductor layer. According to the present invention, the amorphous semiconductor layer deposited on the first epitaxial compound semiconductor layer has a effect of reducing the number of threading dislocations (i.e., the dislocation density), and therefore, the repetition of the amorphous layer deposition and the epitaxial layer growth further decreases the dislocation density. Preferably, the amorphous semiconductor layer has a thickness of from 5 to 20 nm.

The deposition and the growth of the compound semiconductor layers are performed by an MOCVD method or by a molecular beam epitaxy (MBE) method.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Referring to FIGS. 1a to 1c and FIG. 2, a compound semiconductor (for example; GaAs) thin film is formed on a Si substrate, namely, a GaAs/Si substrate is produced in accordance with the present invention.

Figure 1A:
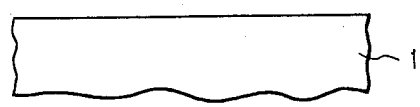
FIGS. 1a to 1c are schematic sectional views of a compound semiconductor/Si substrate in various stages of the formation of the compound semiconductor thin film in accordance with the present invention.

First, as shown in FIG. 1a, a Si substrate (wafer) 1 oriented 4° off (001) toward [110] is cleaned with a hydrofluoric acid (HF) solution, and the cleaned Si substrate 1 is then placed in an MOCVD apparatus. The Si substrate 1 is heated to 900° C. or more (e.g., about 950° C.) and a hydrogen ($H_2$) gas (at 10 l/min) and an arsine ($AsH_3$) gas (at 200 cc/min) are passed through the apparatus to clean the surface of the Si substrate at step A of FIG. 2.

Figure 1B:
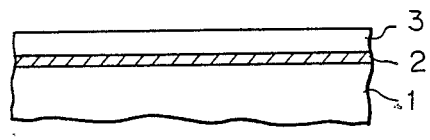
Figure 1C:
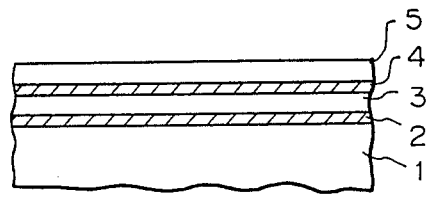
Figure 2:
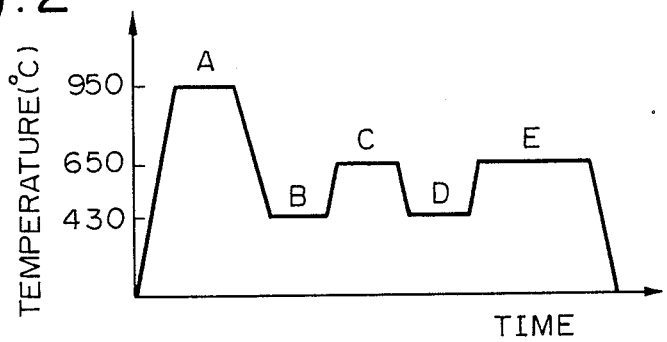
FIG. 2 is a graph showing a temperature variation in the compound semiconductor thin film formation.

As shown in FIG. 1b, by adopting an MOCVD method and the above-mentioned two-step growth sequence, a first amorphous GaAs layer 2 and a first epitaxial GaAs layer 3 are formed on the Si substrate 1, at steps B and C of FIG. 2, respectively.

In the MOCVD process for GaAs, trimethyl gallium (TMG; $(CH_3)_3Ga$) or triethyl gallium (TEG; $(C_2H_5)_3Ga$) are used as the Ga source, which is carried into a reactor of the MOCVD apparatus by a carrier gas of hydrogen ($H_2$), and an arsine ($AsH_3$) gas as an As source. The cleaned Si substrate 1 is cooled to 450° C. or less (e.g., 430° C.), and at this temperature, the $H_2$ carrier gas (at 10 l/min) containing TMG (0.5 to 5 cc/min) and the $AsH_3$ gas (at 200 cc/min) are passed through the reactor to deposit the first amorphous GaAs layer 2 having a thickness of from 5 to 20 nm (e.g., 10 nm) on the Si substrate 1, at step B. The deposition is stopped, and subsequently, the Si substrate 1 is reheated to 650° to 750° C. (e.g., 650° C.). At this temperature the $H_2$ carrier gas (at 10 l/min) containing TMG (1 to 5 cc/min) and the $AsH_3$ gas (at 200 cc/min) are passed through the reactor to epitaxially grow the first epitaxial GaAs layer 3 having a suitable thickness (e.g., 1 μm), at step C. The total thickness of the formed layers 2 and 3 is preferably from 0.1 to 1.0 μm.

Next, in accordance with the present invention, the Si substrate 1 is cooled to a temperature of 450° C. or less (e.g., 430° C.), and then the $H_2$ carrier gas containing TMG and the $AsH_3$ gas under the same conditions as those at step B are passed through the reactor for 1 to 5 minutes, as shown in FIG. 2, to deposit a second amorphous GaAs layer 4 having a thickness of from 5 to 20 nm (e.g., 10 nm) on the first epitaxial GaAs layer, at step D of FIG. 2. Then the Si substrate 1 is reheated to 650° to 750° C. (e.g, 650° C.). At this temperature the $H_2$ carrier gas containing TMG and the $AsH_3$ under the same conditions as those at step C are passed therethrough for 20 to 40 min, minutes, to epitaxially grown a second epitaxial GaAs layer 5 having a thickness of 2 μm. Accordingly, a GaAs/Si substrate having a GaAs thin film consisting of the layers 2 to 5 is produced.

Figure 3:
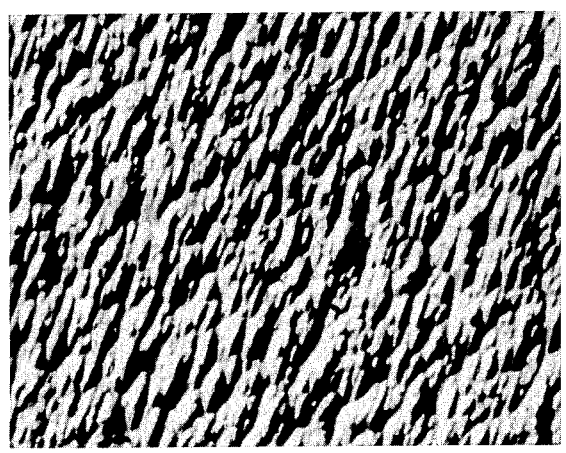
FIG. 3 is a microphotograph of the surface of the top GaAs epitaxial layer of the GaAs/Si substrate formed according to the present invention.

To detect crystal defects of the GaAs/Si substrate, the surface of the second epitaxial GaAs layer 5 is etched for 10 minutes with molten potassium hydroxide (KOH). The etched surface is shown in FIG. 3 as a differential interference microphotograph (×870). It can be seen from FIG. 3 that the dislocation density is $1.8 \times 10^7$ cm$^{-2}$ and no etching pits exist.

Figure 4:
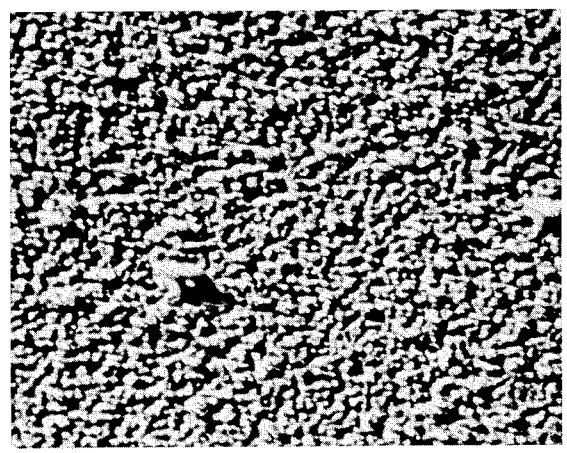
FIG. 4 is a microphotograph of the surface of the top (first) GaAs epitaxial layer formed according to the prior art.

As a comparative example, in step C the first epitaxial GaAs layer 3 is grown, to obtain a thickness thereof of 3 μm. The thus obtained GaAs/Si substrate is produced in accordance with the two-step growth sequence. The surface of the first epitaxial GaAs layer is etched with molten KOH at 350° C., and is shown in FIG. 4 as a differential interference microphotograph (×870). It can be seen from FIG. 4 that the dislocation density is $9.2 \times 10^7$ cm$^{-2}$ and two etching pits exit. In FIGS. 3 and 4, one of the small recesses corresponds to one of the dislocation appearing on the surfaces. The size of the recess in FIG. 3 is larger than that of the recess in FIG. 4, and the number of recesses in FIG. 3 is smaller than that of the recesses in FIG. 4. Therefore the dislocation density of the top epitaxial layer (FIG. 3) of the GaAs thin film formed in accordance with the present invention is as low as one fifth that of the comparative example (FIG. 4).

In the above embodiment, a pair of the second amorphous GaAs layer and the second epitaxial GaAs layer are formed. Where the deposition of the amorphous GaAs layer and the growth of the epitaxial GaAs layer are repeated to form additional pairs of the amorphous and epitaxial GaAs layers on the formed epitaxial GaAs layer, the additional amorphous GaAs layers contribute to a further reduction of the dislocation density.

Figure 5:
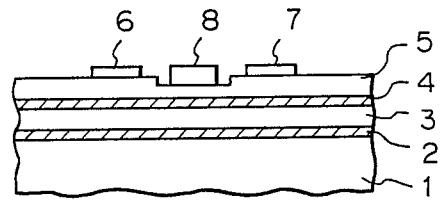
FIG. 5 is a schematic sectional view of a field effect transistor produced by using the GaAs/Si substrate.

By using the produced GaAs/Si substrate (FIG. 1c), a field effect transistor (FET) is produced, as shown in FIG. 5. In this case, the second epitaxial GaAs layer 5 is slightly doped with Si or Se during the epitaxial growth. The GaAs layer 5 is selectively and slightly etched to form a recess and a gate electrode 8 of Au/Au-Ge is formed on the GaAs layer 5 within the recess, and a source electrode 6 and a drain electrode 7 of Pt/Au-Ge are formed on the GaAs layer 5 in a conventional manner. The characteristics of the produced FET are improved due to a reduction of the dislocation density.

It will be obvious that the present invention is not restricted to the above-mentioned embodiments and that many variations are possible for persons skilled in the art without departing from the scope of the invention. For example, instead of GaAs, another III-V compound semiconductor, such as AlGaAs, InP, GaP, InGaAs and InGaAsP can be used.

We claim:

1. A method of forming a semiconductor thin layer on a silicon substrate comprising the steps of depositing a first amorphous layer of a compound semiconductor on said silicon substrate, and growing a first epitaxial layer of the compound semiconductor on said amorphous layer, characterized in that said method further comprises the steps of: after said epitaxial growth step, depositing a second amorphous layer of the compound semiconductor on said first epitaxial layer, and growing a second epitaxial layer of the compound semiconductor on said second amorphous layer.

2. A method according to claim 1, characterized in that said method further comprises, after said second epitaxial growth step, a step of repeating the deposition of the amorphous layer and the growth of the epitaxial layer.

3. A method according to claim 1, characterized in that said compound semiconductor is a III-V compound semiconductor.

4. A method according to claim 3, characterized in that said III-V compound semiconductor is GaAs.

5. A method according to claim 1, characterized in that said deposition of the amorphous layers and said growth of the epitaxial layers are performed by a metal-organic chemical vapor deposition process.

6. A method according to claim 5, characterized in that said deposition of the amorphous layers is performed at a temperature of from 350° to 450° C.

7. A method according to claim 5, characterized in that said growth of the epitaxial layers is performed at a temperature of from 650° to 750° C.

8. A method according to claim 1, characterized in that said deposition of the amorphous layers and said growth of the epitaxial layers are performed by a molecular beam epitaxy process.

* * * * *